(12) United States Patent
Naijo

(10) Patent No.: US 9,171,890 B2
(45) Date of Patent: Oct. 27, 2015

(54) ORGANIC LIGHT EMITTING DIODE DISPLAY

(71) Applicant: SAMSUNG DISPLAY CO., LTD., Yongin, Gyeonggi-Do (KR)

(72) Inventor: Tsuyoshi Naijo, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 178 days.

(21) Appl. No.: 14/065,560

(22) Filed: Oct. 29, 2013

(65) Prior Publication Data

US 2014/0145161 A1    May 29, 2014

(30) Foreign Application Priority Data

Nov. 23, 2012 (KR) .......... 10-2012-0133995

(51) Int. Cl.
*H01L 27/32* (2006.01)
*H01L 51/00* (2006.01)

(52) U.S. Cl.
CPC ........ *H01L 27/3218* (2013.01); *H01L 27/3267* (2013.01); *H01L 51/0097* (2013.01); *H01L 27/3244* (2013.01); *Y02E 10/549* (2013.01)

(58) Field of Classification Search
CPC ............... H01L 27/3209; H01L 27/3218
USPC .................................. 257/40, 98–99
See application file for complete search history.

(56) References Cited

U.S. PATENT DOCUMENTS

| | | | |
|---|---|---|---|
| 2015/0008396 A1* | 1/2015 | Naijo | 257/40 |
| 2015/0041766 A1* | 2/2015 | Naijo | 257/40 |
| 2015/0062465 A1* | 3/2015 | Her | 349/12 |
| 2015/0102298 A1* | 4/2015 | Namkung et al. | 257/40 |

FOREIGN PATENT DOCUMENTS

| KR | 10-0670343 B1 | 1/2007 |
|---|---|---|
| KR | 10-0732429 B1 | 6/2007 |
| KR | 10-2012-0061106 A | 6/2012 |

* cited by examiner

*Primary Examiner* — Cuong Q Nguyen
(74) *Attorney, Agent, or Firm* — Lee & Morse, P.C.

(57) ABSTRACT

An organic light emitting diode display includes a substrate having three folded portions overlapping each other, and a first light emitting unit, a second light emitting unit, and a third light emitting unit on respective ones of the three folded portions of the substrate, the first through third light emitting units overlapping each other and emitting different colors, wherein the first through third light emitting units are on a same surface of the substrate, when the substrate is unfolded to have the three folded portions substantially planar.

18 Claims, 12 Drawing Sheets

ORGANIC LIGHT EMITTING DIODE DISPLAY

RELATED APPLICATIONS

This application claims priority to and the benefit of Korean Patent Application No. 10-2012-0133995, filed in the Korean Intellectual Property Office on Nov. 23, 2012, the entire contents of which are incorporated herein by reference.

BACKGROUND

1. Field

The described technology relates generally to an organic light emitting diode display, and more particularly, to an organic light emitting diode display with an improved arrangement structure of pixels.

2. Description of the Related Art

An organic light emitting diode display includes a plurality of pixels and an organic light emitting diode for each pixel. The organic light emitting diode includes two electrodes and an organic emission layer between the two electrodes. Electrons injected from one electrode and holes injected from the other electrode are coupled with each other in the organic emission layer to generate excitons, so light is emitted while the excitons emit energy.

The organic light emitting diode display includes red pixels, green pixels, and blue pixels to implement color images. A red organic emission layer, a green organic emission layer, and a blue organic emission layer are positioned in the red pixel, the green pixel, and the blue pixel, respectively. The red organic emission layer, the green organic emission layer, and the blue organic emission layer may be formed by a vacuum deposition method using a deposition mask.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide an organic light emitting diode display having high resolution and a simplified manufacturing method, where colors are prevented from being mixed.

An exemplary embodiment provides an organic light emitting diode display, including a substrate having three folded portions overlapping each other, and a first light emitting unit, a second light emitting unit, and a third light emitting unit on respective ones of the three folded portions of the substrate, the first through third light emitting units overlapping each other and emitting different colors, wherein the first through third light emitting units are on a same surface of the substrate, when the substrate is unfolded to have the three folded portions substantially planar.

A part of an outer side of the substrate may define a display side, the first light emitting unit may include a first pixel, the second light emitting unit may include a second pixel spaced apart from the first pixel in a first direction of the display side, and the third light emitting unit may include a third pixel spaced apart from the first pixel and the second pixel in the first direction of the display side.

Each of the first pixel, the second pixel, and the third pixel may be a red pixel, a green pixel, or a blue pixel, the first through third pixels being three different colors.

In an unfolded state of the substrate, the first light emitting unit may be configured as a bottom emission type, and the second light emitting unit and the third light emitting unit are configured as top emission types.

In an unfolded state of the substrate, the first light emitting unit may be configured as a top emission type, and the second light emitting unit and the third light emitting unit are configured as bottom emission types.

An exemplary embodiment provides an organic light emitting diode display, including a substrate including a first area, a second area, and a third area, the first area being between the second and third areas in an unfolded state of the substrate, a first light emitting unit in the first area and including a first pixel, a second light emitting unit in the second area and including a second pixel, and a third light emitting unit in the third area and including a third pixel, wherein, in a folded state of the substrate, the first through third areas overlap each other, and the first through third light emitting units overlap each other.

The substrate may include a display side corresponding to any one area of the first area, the second area, and the third area, the first pixel, the second pixel, and the third pixel being spaced apart from each other in one direction of the display side.

The first pixel may include a first transparent pixel electrode, a first organic emission layer on the first pixel electrode, and a first reflective common electrode on the first organic emission layer.

The first common electrode may include a plurality of electrode parts positioned with predetermined distances therebetween and a wiring part connecting the plurality of electrode parts, each of the plurality of electrode parts corresponding to the first organic emission layer.

The second pixel may include a second reflective pixel electrode, a second organic emission layer on the second pixel electrode, and a second transparent common electrode on the second organic emission layer, and the third pixel may include a third reflective pixel electrode, a third organic emission layer on the third pixel electrode, and a third transparent common electrode on the third organic emission layer.

The second common electrode and the third common electrode may be covered by the transparent buffer layer, and an organic material layer including a hole injection layer, a hole transport layer, and an electron transport layer may be positioned in the first light emitting unit, the second light emitting unit, and the third light emitting unit.

The first pixel, the second pixel, and the third pixel may be included in plural, and the organic material layer may define openings between the first pixels, between the second pixels, and between the third pixels.

The first pixel may include a first reflective pixel electrode, a first organic emission layer on the first pixel electrode, and a first transparent common electrode on the first organic emission layer.

The second pixel may include a second transparent pixel electrode, a second organic emission layer on the second pixel electrode, and a second reflective common electrode on the second organic emission layer, and the third pixel may include a third transparent pixel electrode, a third organic emission layer on the third pixel electrode, and a third reflective common electrode on the third organic emission layer.

The second common electrode and the third common electrode may include a plurality of electrode parts positioned with predetermined distances therebetween and wiring parts connecting the plurality of electrode parts, and each of the plurality of electrode parts may correspond to the second organic emission layer or the third organic emission layer.

The second common electrode and the third common electrode may be covered by a transparent buffer layer, and an organic material layer including a hole injection layer, a hole transport layer, and an electron transport layer may be positioned in the first light emitting unit, the second light emitting unit, and the third light emitting unit.

The first pixel, the second pixel, and the third pixel may be included in plural, and the organic material layer may define openings between the first pixels, between the second pixels, and between the third pixels.

The organic light emitting diode display may further include a first sealant along one end of the folded substrate to seal the first light emitting unit and the second light emitting unit, and a second sealant along an opposite end of the folded substrate to seal the third light emitting unit.

DETAILED DESCRIPTION

Example embodiments will be described more fully hereinafter with reference to the accompanying drawings, in which some exemplary embodiments are shown. As those skilled in the art would realize, the described embodiments may be modified in various different ways, all without departing from the inventive scope.

In the specification, unless explicitly described to the contrary, the word "comprise" and variations such as "comprises" or "comprising", will be understood to imply the inclusion of stated elements but not the exclusion of any other elements. Further, in the specification, it will be understood that when an element such as a layer, film, region, or substrate is referred to as being "on" another element, it can be directly on the other element or intervening elements may also be present. In addition, the word "on" means positioning on or below the object portion, but does not essentially mean positioning on the upper side of the object portion based on a gravity direction.

Figure 1:
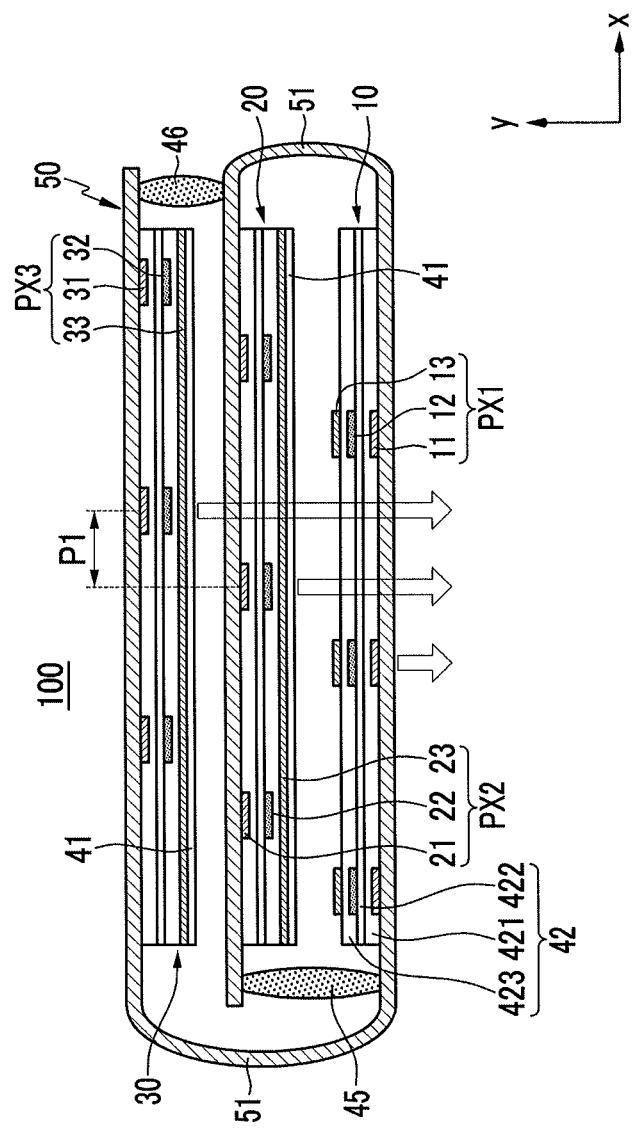
FIG. 1 is a cross-sectional view of an organic light emitting diode display according to a first exemplary embodiment.
Figure 2:
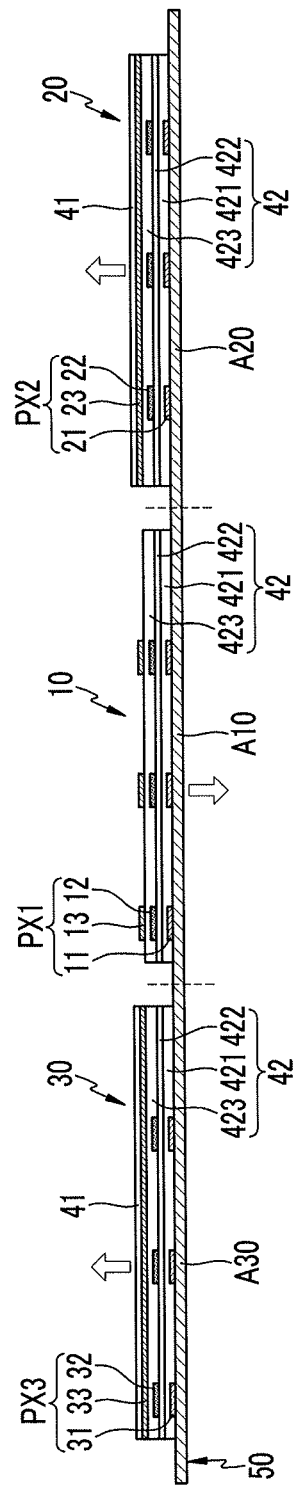
FIG. 2 is a cross-sectional view illustrating an unfolded substrate of FIG. 1.
Figure 3:
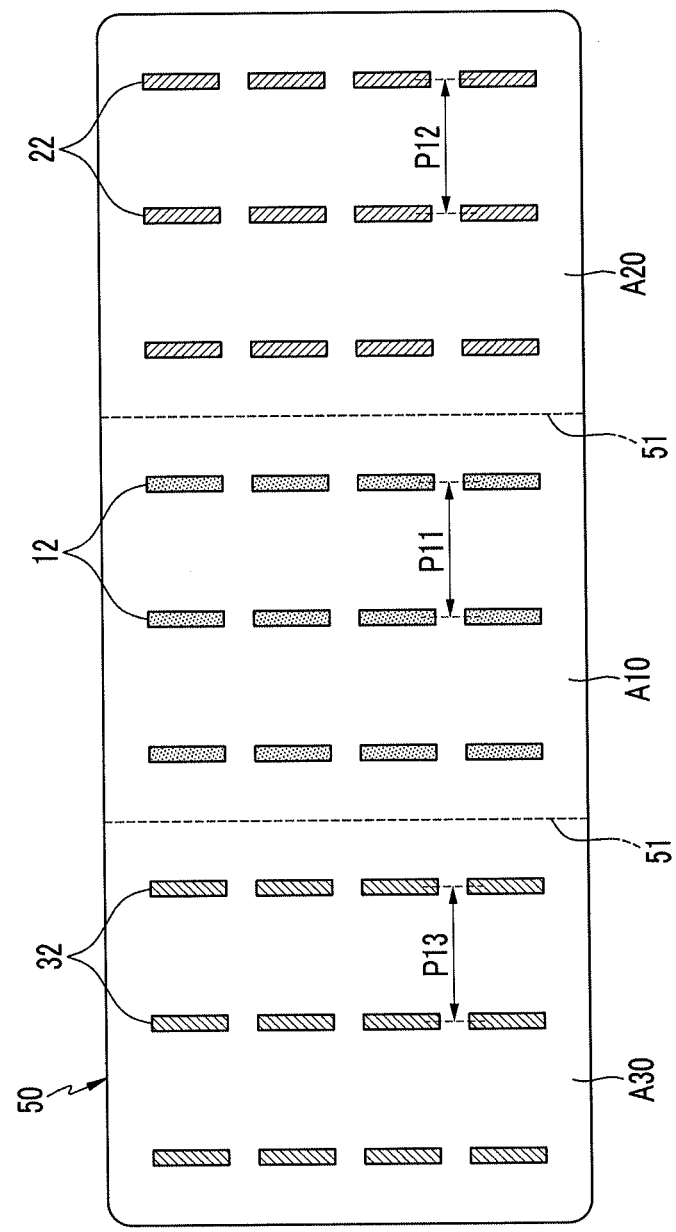
FIG. 3 is a plan view illustrating the substrate and organic emission layers of FIG. 2.

FIG. 1 is a cross-sectional view of an organic light emitting diode display according to a first exemplary embodiment, FIG. 2 is a cross-sectional view illustrating an unfolded substrate in FIG. 1, and FIG. 3 is a plan view illustrating the substrate and organic emission layers in FIG. 2.

Referring to FIGS. 1 to 3, an organic light emitting diode display 100 of the first exemplary embodiment includes a substrate 50 folded twice, first and second light emitting units 10 and 20 on the substrate 50 and overlapping each other by folding the substrate 50, and a third light emitting unit 30. Each of the first light emitting unit 10, the second light emitting unit 20, and the third light emitting unit 30 emits any one color of red, green, and blue, and a color image is implemented in combination of three light emitting colors.

The substrate 50 exhibits transparent and bending characteristics, e.g., the substrate 50 may be formed of a transparent polymer film. For example, the substrate 50 may have a bending characteristic only at a bending portion. In detail, as illustrated in FIG. 2, the substrate 50 includes a first area A10, a second area A20, and a third area A30, so the second and third areas A20 and A30 may be positioned at both sides of the first area A10 in the unfolded state. As illustrated in FIG. 1, folding parts 51 are formed between the first area A10 and the second area A20, and between the first area A10 and the third area A30.

Referring to FIG. 2, in the state where the substrate 50 is unfolded, the first light emitting unit 10 is positioned in the first area A10 on the substrate 50, the second light emitting unit 20 is positioned in the second area A20 on the substrate 50, and the third light emitting unit 30 is positioned in the third area A30 on the substrate 50. The first light emitting unit 10, the second light emitting unit 20, and the third light emitting unit 30 are formed on one side of the substrate 50, e.g., on a same surface of the substrate 50, to be parallel to each other. A plurality of signal lines (not illustrated) is formed throughout the first light emitting unit 10, the second light emitting unit 20, and the third light emitting unit 30 on one side of the substrate 50.

The first light emitting unit 10 includes a plurality of first pixels PX1. The first pixel PX1 is any one of a red pixel, a green pixel, and a blue pixel. The second light emitting unit 20 includes a plurality of second pixels PX2. The second pixel PX2 is any one of the red pixel, the green pixel, and the blue pixel. The third light emitting unit 30 includes a plurality of third pixels PX3. The third pixel PX3 is any one of the red pixel, the green pixel, and the blue pixel.

In the state where the substrate 50 is unfolded, the first light emitting unit 10 is a bottom emission type, i.e., in which light is emitted toward the substrate 50, and the second light emitting unit 20 and the third light emitting unit 30 may be a top emission type, i.e., in which light is emitted toward an opposite side of the substrate 50.

In detail, the first pixel PX1 of the first light emitting unit 10 includes a first transparent pixel electrode 11, a first organic emission layer 12 formed on the first pixel electrode 11, and a first reflective common electrode 13 formed on the first organic emission layer 12. The first pixel electrode 11 is made of a transparent metal oxide, e.g., indium tin oxide (ITO), and the first common electrode 13 may be made of metal. The light generated in the first organic emission layer 12 is reflected by the first common electrode 13 and passes through the first pixel electrode 11 and the substrate 50.

The second pixel PX2 of the second light emitting unit 20 includes a second reflective pixel electrode 21, a second organic emission layer 22 formed on the second pixel electrode 21, and a second transparent common electrode 23 formed on the second organic emission layer 22. The second pixel electrode 21 is made of metal, and the second common electrode 23 may be made of a transparent metal oxide. The light generated in the second organic emission layer 22 is reflected in the second pixel electrode 21 and passes through the second common electrode 23.

The third pixel PX3 of the third light emitting unit 30 includes a third reflective pixel electrode 31, a third organic emission layer 32 formed on the third pixel electrode 31, and a third transparent common electrode 33 formed on the third organic emission layer 32. The third pixel electrode 31 is made of metal, and the third common electrode 33 may be made of a transparent metal oxide. The light generated in the third organic emission layer 32 is reflected by the third pixel electrode 31 and passes through the third common electrode 33.

In this case, a transparent buffer layer 41 is formed on, e.g., to entirely cover, the second light emitting unit 20 and the third light emitting unit 30 above the second common electrode 23 and the third common electrode 33, respectively. The transparent buffer layer 41 covers and protects the plurality of second pixels PX2 and the plurality of third pixels PX3. The transparent buffer layer 41 may be formed of an inorganic material, e.g., silicon oxide, or an organic material, e.g., polyimide.

The pixel electrodes 11, 21, and 31 may be anodes supplying holes, and the common electrodes 13, 23, and 33 may be cathodes supplying electrons in all of the first light emitting unit 10 to the third light emitting unit 30. An organic material layer 42 including a hole injection layer 421, a hole transport layer 422, and an electron transport layer 423 may be positioned in the first light emitting unit 10 to the third light emitting unit 30. The hole injection layer 421 and the hole transport layer 422 are positioned between each of the pixel electrodes 11, 21 and 31, and a corresponding one of the organic emission layers 12, 22, and 32. The electron transport layer 423 is positioned between each of the organic emission layers 12, 22 and 32, and a corresponding one of the common electrodes 13, 23, and 33.

The organic material layer 42 may be formed throughout one side of the substrate 50, e.g., continuously and entirely extend on one surface of the substrate 50, or may be formed on one side of the substrate 50 except for the bending portion of the substrate 50, e.g., extend discontinuously to expose the folding parts 51 of the substrate 50. In the latter case, as illustrated in FIGS. 1-2, the organic material layer 42 is divided for each area, e.g., the organic material layer 42 extends continuously only in corresponding regions of the first through third light emitting units 10 through 30 to have a portion of the substrate between adjacent light emitting units of the first through third light emitting units 10 through 30 exposed.

As illustrated in FIG. 1, the substrate 50 is folded at a boundary between the first area A10 and the second area A20, so that the second light emitting unit 20 faces the first light emitting unit 10. Similarly, the substrate 50 is further folded at a boundary between the first area A10 and the third area A30, so that the third light emitting unit 30 overlaps the first light emitting unit 10. In the state where the substrate 50 is folded, the third light emitting unit 30 faces the first light emitting unit 10 with the second light emitting unit 20 therebetween. That is, the first light emitting unit 10, the second light emitting unit 20, and the third light emitting unit 30 are sequentially positioned from bottom to top in a thickness direction (vertical direction of FIG. 1) of the organic light emitting diode display 100. For example, the substrate 50 may be folded to have the first through third light emitting units 10 through 30 stacked to overlap each other, with the second the light emitting unit 20 between the first and third light emitting units 10 and 30.

In the case where the folding order of the substrate 50 is different from the above order, the first light emitting unit 10, the third light emitting unit 30, and the second light emitting unit 20 are sequentially positioned from bottom to top in a thickness direction of the organic light emitting diode display 100. In FIG. 1, the former case is illustrated as an example.

In the state where the substrate 50 is unfolded, a vertical positional relationship between the second light emitting unit 20 and the third light emitting unit 30, which are configured as the top emission types, is reversed due to the unfolding of the substrate 50. Therefore, as illustrated in FIG. 2, the second light emitting unit 20 and the third light emitting unit 30 emit light in the same direction, and in an opposite direction relatively to the first light emitting unit 10 (see white arrows). In the state where the substrate 50 is folded, as illustrated in FIG. 2, light of all the light emitting units, i.e., the first through third light emitting units 10 through 30 faces downward.

In a folded state, as illustrated in FIG. 1, a display side of the organic light emitting diode display 100 is defined as an outer side of the first area A10, i.e., where the first light emitting unit 10 is positioned in the substrate 50. The light of the first light emitting unit 10 passes through the substrate 50 to be emitted to the outside of the display side, i.e., through the outer side of the first area A10, and the light of the second light emitting unit 20 passes through the first light emitting unit 10 and the substrate 50 to be emitted to the outside of the display side. In addition, the light of the third light emitting unit 30 passes through the second light emitting unit 20, the first light emitting unit 10, and substrate 50 to be emitted to the outside of the display side.

Further, in the state where the substrate 50 is folded, the first pixel PX1, the second pixel PX2, and the third pixel PX3 are spaced apart from each other in one direction, e.g., x-axis in FIG. 1, of the display side, so as not to overlap each other in the thickness direction, e.g., y-axis in FIG. 1, of the organic light emitting diode display 100. Accordingly, the light emitted from the second pixel PX2 is not mixed with the light emitted from the first pixel PX1, and the light emitted from the third pixel PX3 is not mixed with the light emitted from either of the second pixel PX2 and the first pixel PX1.

Figure 4:
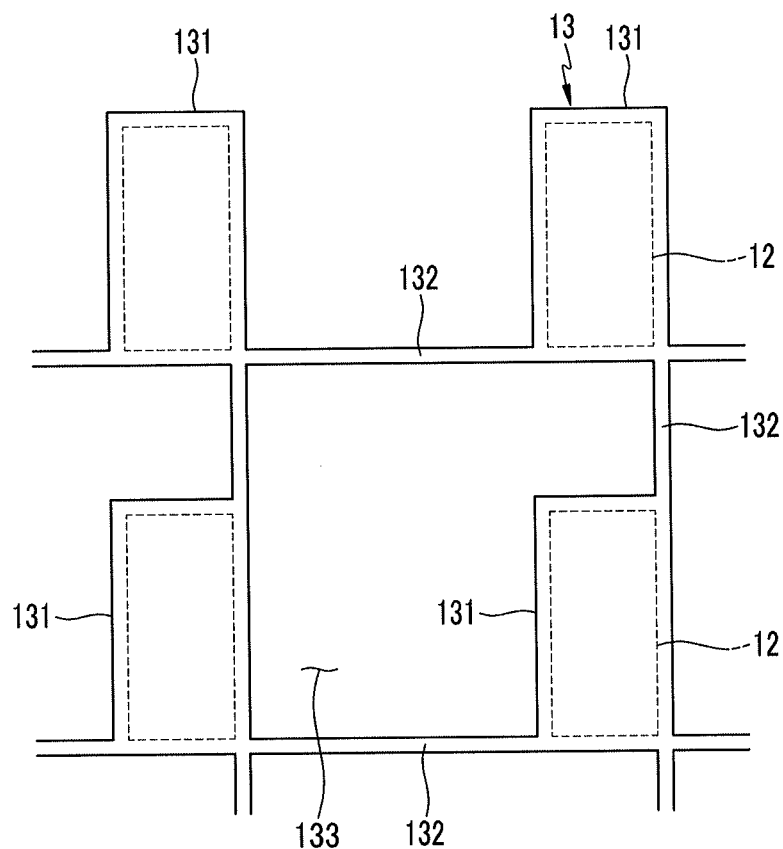
FIG. 4 is a plan view illustrating a first common electrode in the organic light emitting diode display in FIG. 1.

Meanwhile, the first light emitting unit 10 includes the first reflective common electrode 13. When a conventional common electrode is formed to continuously cover an entire light emitting unit, e.g., the entire first light emitting unit 10, light, e.g., from the second light emitting unit 20 and the third light emitting unit 30, may not pass through the light emitting unit. However, the first reflective common electrode 13 provide structure that passes light, as will be described in detail with reference to FIG. 4. FIG. 4 is a plan view illustrating the first common electrode 13.

Referring to FIG. 4, the first common electrode 13 may include a plurality of electrode parts 131 which are positioned with predetermined distances therebetween, and a wiring part 132 conducting current by connecting the plurality of electrode parts 131. Each electrode part 131 is formed at the same position as the first organic emission layer 12 to correspond to the first organic emission layer 12. As an opening area 133 is formed between the electrode parts 131, the light of the second light emitting unit 20 and the third light emitting unit 30 may pass through the first light emitting unit 10 through the opening area 133.

Referring back to FIGS. 1 to 3, the organic light emitting diode display 100 may include two sealants 45 and 46. The sealants 45 and 46 serve to fix the folded state of the substrate 50 and prevent external air from flowing into the first light emitting unit 10 to the third light emitting unit 30.

The first sealant 45 is formed along an end of the folded substrate 50, after the substrate 50 is folded at the boundary between the first area A10 and the second area A20, to seal the first light emitting unit 10 and the second light emitting unit 20. The second sealant 46 is formed along an end of the folded substrate 50, after the substrate 50 is folded at the boundary between the first area A10 and the third area A30, to seal the third light emitting unit 30. The sealing structure may prevent moisture and oxygen included in the external air from permeating into the first light emitting unit 10 to the third light emitting unit 30.

As described above, the organic light emitting diode display 100 of the first exemplary embodiment includes the first pixels PX1, the second pixels PX2, and the third pixels PX3 in different rows on the folded substrate 50, while the first through third pixels are divided for each area. In other words, each group of the first through third pixels PX1 through PX3 is arranged in a different respective area of the first through third areas A10 through A30, so the folded areas A10 through A30 on the substrate 50 provide each group of pixels PX1 through PX3 in a different row, i.e., different folded portion of the substrate 50. As the substrate 50 is folded twice, the groups of the first pixels PX1, the second pixels PX2, and the third pixels PX3 are laminated to be spaced apart from each other in two directions, e.g., along the y-axis due to the separated different folded portions of the substrate 50 and along the x-axis to avoid overlap and allow light transmittance.

In FIG. 1, a pitch, i.e., a distance between centers, of all the pixels is indicated as P1, e.g., a horizontal distance along the x-axis between centers of every two adjacent pixels, regardless of color and row, is indicated as P1. For example, as illustrated in FIG. 1, a pitch between a third pixel PX3 in the third area A30 (top row of the folded substrate 50) and an adjacent second pixel PX2 in the second area A20 (middle row of the folded substrate 50) is P1.

Accordingly, only organic emission layers of a same color are positioned at each of the first area A10, the second area A20, and the third area A30 of the substrate 50. As a result, when the first organic emission layer 12, the second organic emission layer 22, and the third organic emission layer 32 are formed, e.g., on the substrate 50 in an unfolded state, by the vacuum deposition method using the deposition mask, a specific organic emission layer is prevented from intruding into a pixel having a different color due to the separated areas.

In addition, as illustrated in FIG. 3, a pitch P11 between the first pixels, a pitch P12 between the second pixels, and a pitch P13 between the third pixels are set to a value three times larger than the pitch P1 of all of the pixels. Accordingly, since a high-precision deposition mask having a very small distance between deposition openings is not required, the organic light emitting diode display 100 may be easily manufactured. Further, the organic light emitting diode display 100 of the first exemplary embodiment may efficiently seal all of the first light emitting unit 10 to the third light emitting unit 30 by using one substrate 50 and two sealants 45 and 46 without an encapsulation film.

In addition, since the pitch P1 of all the pixels may be set to be very small without concern over the mixed color, high resolution screen may be implemented.

Figure 5:
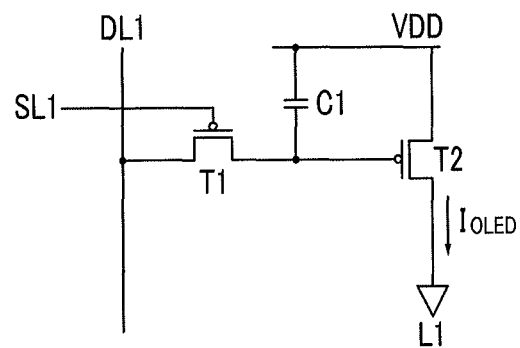
FIG. 5 is a diagram illustrating a pixel circuit of the organic light emitting diode display in FIG. 1.
Figure 6:
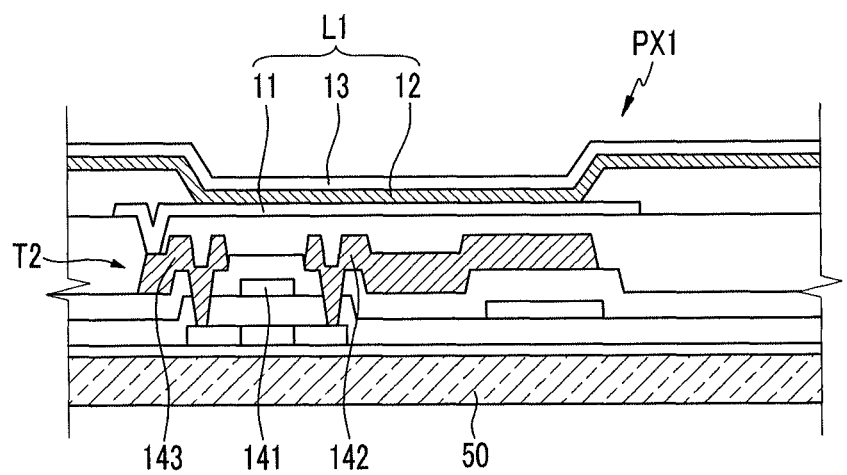
FIG. 6 is a partially enlarged cross-sectional view of the organic light emitting diode display in FIG. 1.

FIG. 5 is a diagram illustrating a pixel circuit of the organic light emitting diode display 100, and FIG. 6 is a partially enlarged cross-sectional view of the organic light emitting diode display 100.

Referring to FIGS. 5 and 6, the first pixel PX1 includes a first organic light emitting diode L1 and driving circuit parts T1, T2, and C1. The first organic light emitting diode L1 includes the first pixel electrode 11, the first organic emission layer 12, and the first common electrode 13. The driving circuit parts T1, T2, and C1 include at least two thin film transistors, e.g., a switching transistor T1 and a driving transistor T2, and at least one capacitor C1.

The switching transistor T1 is connected to a scan line SL1 and a data line DL1, and transmits data voltage input from the data line DL1 to the driving transistor T2 according to switching voltage input to the scan line SL1. The capacitor C1 is connected to the switching transistor T1 and a power supply line VDD and stores voltage corresponding to a difference between the voltage received from the switching transistor T1 and the voltage supplied to the power supply line VDD.

The driving transistor T2 is connected to the power supply line VDD and the capacitor C1 to supply an output current $I_{OLED}$ that is proportional to the square of the difference between the voltage stored in the capacitor C1 and threshold voltage to the organic light emitting diode L1, and the organic light emitting diode L1 emits light at an intensity proportional to the output current $I_{OLED}$. The driving transistor T2 includes a gate electrode 141 and source/drain electrodes 142 and 143, and the first pixel electrode 11 may be connected to the drain electrode 143 of the driving transistor T2.

The cross-sectional structures of the pixel circuit illustrated in FIG. 5 and the first pixel PX1 illustrated in FIG. 6 are only one example, and the organic light emitting diode display 100 of the first exemplary embodiment is not limited to the aforementioned example and may be variously modified. Further, the structure of the first pixel PX1 is described above, but the second pixel PX2 and the third pixel PX3 are configured by the same structure as that of the first pixel PX1 described above.

Figure 7:
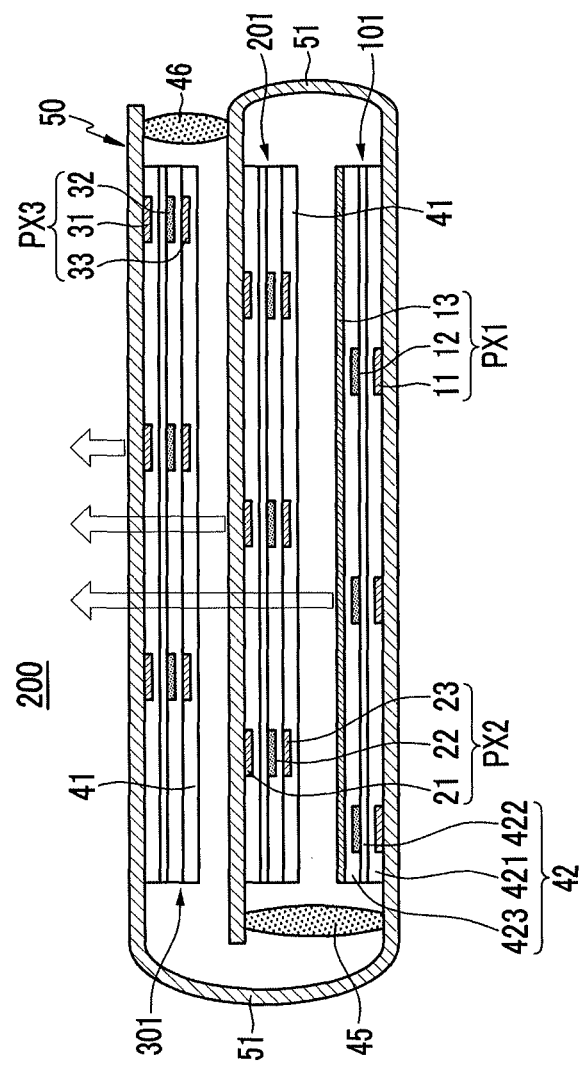
FIG. 7 is a cross-sectional view of an organic light emitting diode display according to a second exemplary embodiment.
Figure 8:
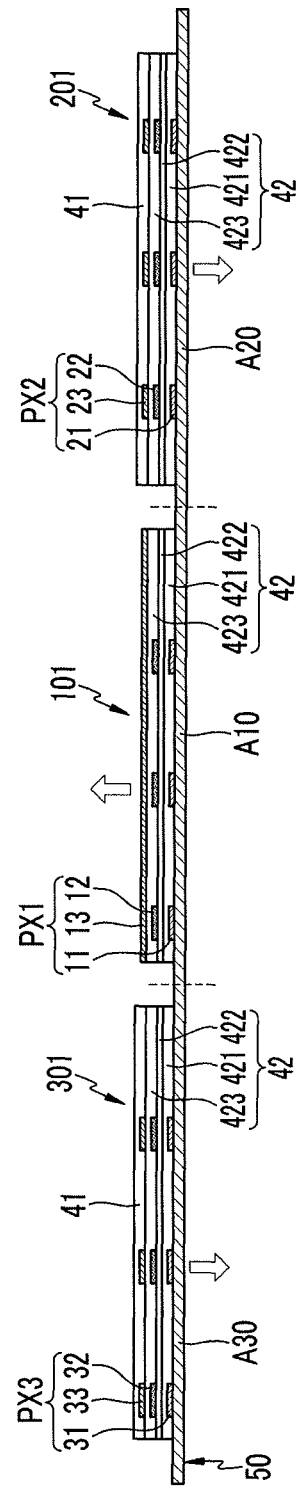
FIG. 8 is a cross-sectional view illustrating an unfolded substrate of FIG. 7.

FIG. 7 is a cross-sectional view of an organic light emitting diode display according to a second exemplary embodiment, and FIG. 8 is a cross-sectional view illustrating an unfolded substrate in the organic light emitting diode display of FIG. 7.

Referring to FIGS. 7 and 8, an organic light emitting diode display 200 of the second exemplary embodiment is configured by the same structure as that of the organic light emitting diode display 100 of the first exemplary embodiment described above, except that a first light emitting unit 101 is configured as a top emission type, and a second light emitting unit 201 and a third light emitting unit 301 are configured as bottom emission types in the state where the substrate 50 is unfolded. The same members as the first exemplary embodiment use the same reference numerals, and a different configuration from the first exemplary embodiment will be mainly described below.

The first pixel PX1 of the first light emitting unit 101 includes the first reflective pixel electrode 11, the first organic emission layer 12 formed on the first pixel electrode 11, and the first transparent common electrode 13 formed on the first organic emission layer 12. The light generated in the first organic emission layer 12 is reflected by the first pixel electrode 11 and passes through the first common electrode 13.

The second pixel PX2 of the second light emitting unit 201 includes the second transparent pixel electrode 21, the second organic emission layer 22 formed on the second pixel electrode 21, and the second reflective common electrode 23 formed on the second organic emission layer 22. The light generated in the second organic emission layer 22 is reflected by the second common electrode 23 and passes through the second pixel electrode 21 and the substrate 50.

The third pixel PX3 of the third light emitting unit 301 includes the third transparent pixel electrode 31, the third organic emission layer 32 formed on the third pixel electrode 31, and the third reflective common electrode 33 formed on the third organic emission layer 32. The light generated in the third organic emission layer 32 is reflected by the third common electrode 33 and passes through the third pixel electrode 31 and the substrate 50.

In the second exemplary embodiment, a display side of the organic light emitting diode display 200 is defined as an outer side of the third area A30 where the third light emitting unit 301 is positioned in the substrate 50. The light of the third light emitting unit 301 passes through the substrate 50 to be emitted to the outside of the display side, and the light of the second light emitting unit 201 passes through the third light emitting unit 301 and the substrate 50 to be emitted to the outside of the display side. In addition, the light of the first light emitting unit 101 passes through the second light emitting unit 201, the third light emitting unit 301, and substrate 50 to be emitted to the outside of the display side.

In the case where the folded order of the substrate 50 is different from the above order, the third light emitting unit 301 and the second light emitting unit 201 are sequentially laminated on the first light emitting unit 101. In this case, the display side of the organic light emitting diode display 200 is defined as an outer side of the second area A20 where the second light emitting unit 201 is positioned in the substrate 50.

Figure 9:
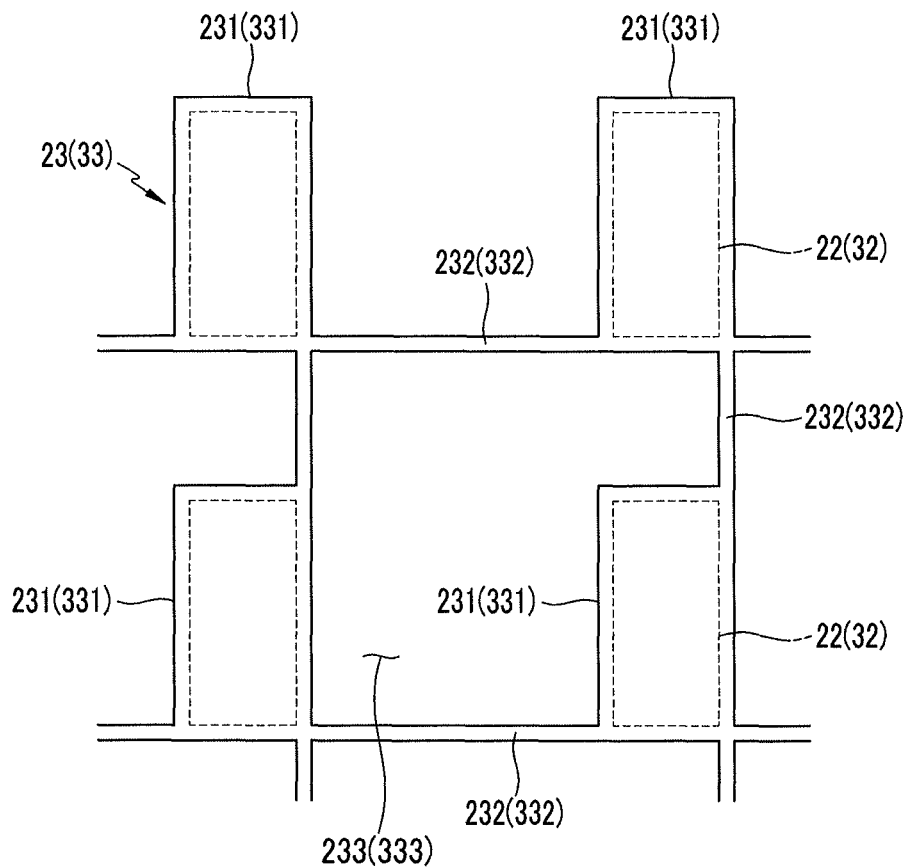
FIG. 9 is a plan view illustrating a second common electrode and a third common electrode of the organic light emitting diode display in FIG. 7.

FIG. 9 is a plan view illustrating a second common electrode and a third common electrode of the organic light emitting diode display 200.

Referring to FIG. 9, the second common electrode 23 and the third common electrode 33 may include a plurality of electrode parts 231 and 331, which are positioned with predetermined distances therebetween, and wiring parts 232 and 332 conducting current by connecting the plurality of electrode parts 231 and 331. The electrode part 231 of the second common electrode 23 is formed at the same position as the second organic emission layer 22, and the electrode part 331 of the third common electrode 33 is formed at the same position as the third organic emission layer 32. As opening areas 233 and 333 are formed between the electrode parts 231 and 331, the light of the first light emitting unit 101 may pass through the second light emitting unit 201 and the third light emitting unit 301 and the light of the second light emitting unit 201 may pass through the third light emitting unit 301.

Figure 10:
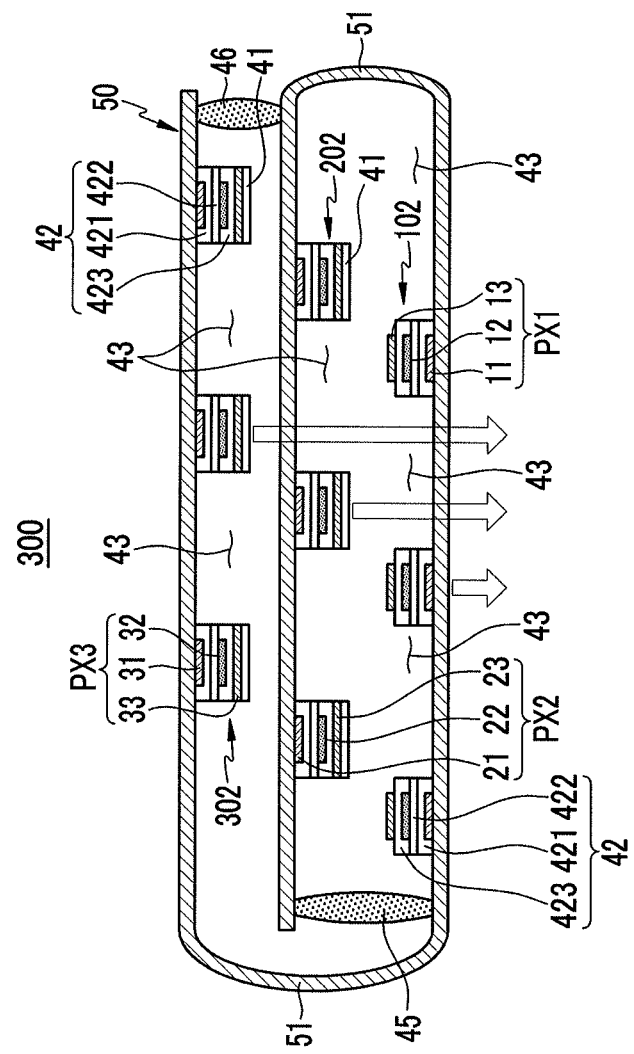
FIG. 10 is a cross-sectional view of an organic light emitting diode display according to a third exemplary embodiment.
Figure 11:
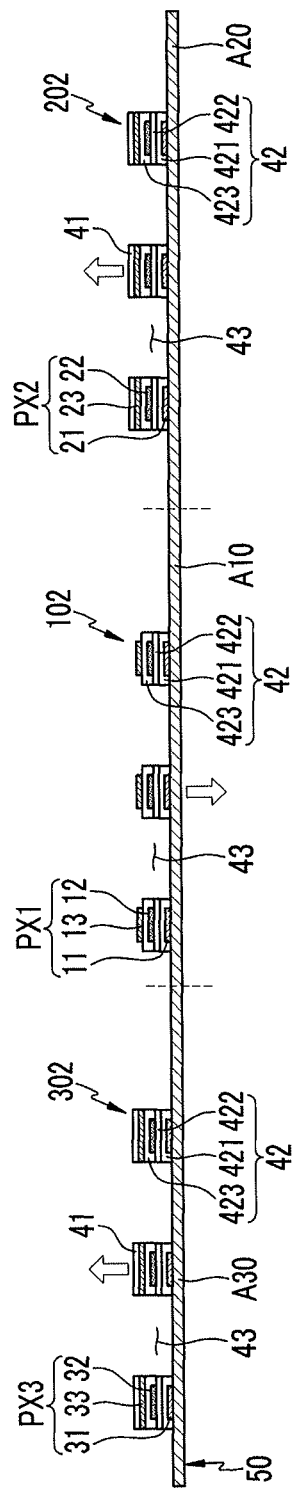
FIG. 11 is a cross-sectional view illustrating an unfolded substrate in FIG. 10.

FIG. 10 is a cross-sectional view of an organic light emitting diode display according to a third exemplary embodiment, and FIG. 11 is a cross-sectional view illustrating an unfolded substrate of the organic light emitting diode display in FIG. 10.

Referring to FIGS. 10 and 11, an organic light emitting diode display 300 of the third exemplary embodiment is configured by the same structure as that of the organic light emitting diode display 100 of the first exemplary embodiment described above, except that an organic material layer 42 (including a hole injection layer 421, a hole transport layer 422, and an electron transport layer 423) and a transparent buffer layer 41 form openings 43 between pixels. The same members as in the first exemplary embodiment use the same reference numerals, and a different configuration from the first exemplary embodiment will be mainly described below.

In a first light emitting unit 102, the organic material layer 42 forms the opening 43 between the first pixels PX1. In a second light emitting unit 202, the organic material layer 42 and the transparent buffer layer 41 form the openings 43 between the second pixels PX2. In a third light emitting unit 302, the organic material layer 42 and the transparent buffer layer 41 form the openings 43 between the third pixels PX3. The openings 43 may be formed by a dry etching method, e.g., plasma etching, and in this case, a side wall of the opening 43 is vertical to the substrate 50.

In the state where the substrate 50 is folded, the opening 43 of the first light emitting unit 102 is overlapped with the second pixel PX2 and the third pixel PX3, and the opening 43 of the second light emitting unit 202 is overlapped with the third pixel PX3. Accordingly, when the light of the second light emitting unit 202 and the third light emitting unit 302 passes through the first light emitting unit 102, and when the light of the third light emitting unit 302 passes through the second light emitting unit 202, light loss due to the organic material layer 42 and the transparent buffer layer 41 may be minimized. As a result, the organic light emitting diode display 300 of the third exemplary embodiment may implement a high-luminance screen by increasing light extraction efficiency of the second light emitting unit 202 and the third light emitting unit 302.

Figure 12:
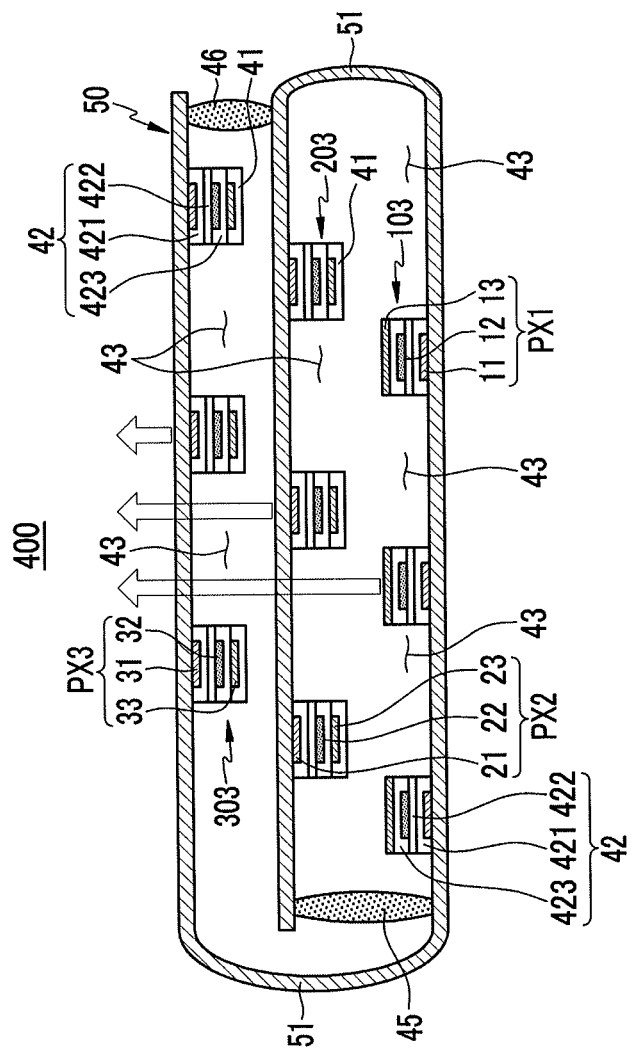
FIG. 12 is a cross-sectional view of an organic light emitting diode display according to a fourth exemplary embodiment.
Figure 13:
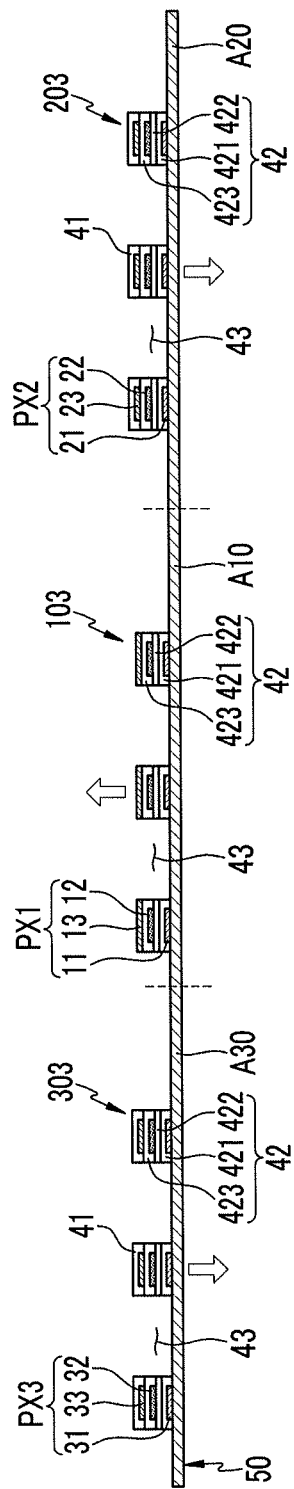
FIG. 13 is a cross-sectional view illustrating an unfolded substrate in FIG. 12.

FIG. 12 is a cross-sectional view of an organic light emitting diode display according to a fourth exemplary embodiment, and FIG. 13 is a cross-sectional view illustrating an unfolded substrate of the organic light emitting diode display in FIG. 12.

Referring to FIGS. 12 and 13, an organic light emitting diode display 400 of the fourth exemplary embodiment is configured by the same structure as that of the organic light emitting diode display of the second exemplary embodiment described above, except that an organic material layer 42 (including a hole injection layer 421, a hole transport layer 422, and an electron transport layer 423) and a transparent buffer layer 41 form openings 43 between pixels. The same members as in the second exemplary embodiment use the same reference numerals.

In the first light emitting unit 103, the organic material layer 42 forms the opening 43 between the first pixels PX1, and in the second light emitting unit 203, the organic material layer 42 and the transparent buffer layer 41 form the openings 43 between the second pixels PX2. In the third light emitting unit 303, the organic material layer 42 and the transparent buffer layer 41 form the openings 43 between the third pixels PX3.

In the state where the substrate 50 is folded, the opening 43 of the third light emitting unit 303 is overlapped with the first pixel PX1 and the second pixel PX2, and the opening 43 of the second light emitting unit 203 is overlapped with the first pixel PX1. Accordingly, when the light of the first light emitting unit 103 and the second light emitting unit 203 passes through the third light emitting unit 303, and when the light of the second light emitting unit 203 passes through the first light emitting unit 103, light loss due to the organic material layer 42 and the transparent buffer layer 41 may be minimized.

According to the exemplary embodiments, a substrate is folded to have pixels in different rows, so the pixels are arranged to be spaced apart from each other in each row horizontally, so as not to overlap each other vertically. Accordingly, light emitted from each pixel is not mixed with pixel light from adjacent rows or columns. As organic emission layers corresponding to the pixels are formed by a vacuum deposition method using a deposition mask, a specific organic emission layer may not intrude into a different-colored pixel. Further, since a high-precision deposition mask having a very small distance between deposition openings is not required, e.g., due to the pixel spacing, the organic light emitting diode display may be easily manufactured. In addition, since a pitch of all the pixels may be set to be very small without concern over the mixed color, a high resolution screen may be implemented.

In contrast, when a vacuum deposition method with a deposition mask is used in conventional arrangement of pixel, e.g., in a display device with a flat substrate, a mixed color may be generated when two colored organic emission layers are overlapped with each other according to an arrangement state of the deposition mask and substrate. For example, when the red organic emission layer is deposited after forming the blue organic emission layer and the green organic emission layer, if the substrate and the deposition mask are misaligned or a distance between the substrate and the deposition mask is excessively set, the red organic emission layer may intrude into at least one of a green pixel and a blue pixel. Accordingly, manufacturing a high-resolution organic light emitting diode display with a conventional substrate and pixel arrangement having a very small distance between pixels, may be difficult.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| <Description of symbols> |
| --- |
| 100, 200, 300, 400: Organic light emitting diode display |
| 10: First light emitting unit    20: Second light emitting unit |
| 30: Third light emitting unit    41: Transparent buffer layer |
| 42: Organic material layer      50: Substrate |
| PX1, PX2, PX3: First pixel, Second pixel, Third pixel |
| A10, A20, A30: First area, Second area, Third area |

What is claimed is:

1. An organic light emitting diode display, comprising:
   a substrate having three folded portions overlapping each other; and
   a first light emitting unit, a second light emitting unit, and a third light emitting unit on respective ones of the three folded portions of the substrate, the first through third light emitting units overlapping each other and emitting different colors,
   wherein the first through third light emitting units are on a same surface of the substrate, when the substrate is unfolded to have the three folded portions substantially planar.

2. The organic light emitting diode display of claim 1, wherein:
   a part of an outer side of the substrate defines a display side,
   the first light emitting unit includes a first pixel,
   the second light emitting unit includes a second pixel spaced apart from the first pixel in a first direction of the display side, and
   the third light emitting unit includes a third pixel spaced apart from the first pixel and the second pixel in the first direction of the display side.

3. The organic light emitting diode display of claim 2, wherein each of the first pixel, the second pixel, and the third pixel is a red pixel, a green pixel, or a blue pixel, the first through third pixels being three different colors.

4. The organic light emitting diode display of claim 3, wherein, in an unfolded state of the substrate, the first light emitting unit is configured as a bottom emission type, and the second light emitting unit and the third light emitting unit are configured as top emission types.

5. The organic light emitting diode display of claim 3, wherein, in an unfolded state of the substrate, the first light emitting unit is configured as a top emission type, and the second light emitting unit and the third light emitting unit are configured as bottom emission types.

6. An organic light emitting diode display, comprising:
   a substrate including a first area, a second area, and a third area, the first area being between the second and third areas in an unfolded state of the substrate;
   a first light emitting unit in the first area and including a first pixel;
   a second light emitting unit in the second area and including a second pixel; and
   a third light emitting unit in the third area and including a third pixel,
   wherein, in a folded state of the substrate, the first through third areas overlap each other, and the first through third light emitting units overlap each other.

7. The organic light emitting diode display of claim 6, wherein the substrate includes a display side corresponding to any one area of the first area, the second area, and the third area, the first pixel, the second pixel, and the third pixel being spaced apart from each other in one direction of the display side.

8. The organic light emitting diode display of claim 7, wherein the first pixel includes a first transparent pixel electrode, a first organic emission layer on the first pixel electrode, and a first reflective common electrode on the first organic emission layer.

9. The organic light emitting diode display of claim 8, wherein the first common electrode includes a plurality of electrode parts positioned with predetermined distances therebetween and a wiring part connecting the plurality of electrode parts, each of the plurality of electrode parts corresponding to the first organic emission layer.

10. The organic light emitting diode display of claim 8, wherein:
    the second pixel includes a second reflective pixel electrode, a second organic emission layer on the second pixel electrode, and a second transparent common electrode on the second organic emission layer, and
    the third pixel includes a third reflective pixel electrode, a third organic emission layer on the third pixel electrode, and a third transparent common electrode on the third organic emission layer.

11. The organic light emitting diode display of claim 10, wherein:
    the second common electrode and the third common electrode are covered by the transparent buffer layer, and
    an organic material layer including a hole injection layer, a hole transport layer, and an electron transport layer is positioned in the first light emitting unit, the second light emitting unit, and the third light emitting unit.

12. The organic light emitting diode display of claim 11, wherein:
    the first pixel, the second pixel, and the third pixel are included in plural, and
    the organic material layer defines openings between the first pixels, between the second pixels, and between the third pixels.

13. The organic light emitting diode display of claim 7, wherein the first pixel includes a first reflective pixel electrode, a first organic emission layer on the first pixel electrode, and a first transparent common electrode on the first organic emission layer.

14. The organic light emitting diode display of claim 13, wherein:
  the second pixel includes a second transparent pixel electrode, a second organic emission layer on the second pixel electrode, and a second reflective common electrode on the second organic emission layer, and
  the third pixel includes a third transparent pixel electrode, a third organic emission layer on the third pixel electrode, and a third reflective common electrode on the third organic emission layer.

15. The organic light emitting diode display of claim 14, wherein:
  the second common electrode and the third common electrode include a plurality of electrode parts positioned with predetermined distances therebetween and wiring parts connecting the plurality of electrode parts, and
  each of the plurality of electrode parts corresponds to the second organic emission layer or the third organic emission layer.

16. The organic light emitting diode display of claim 14, wherein:
  the second common electrode and the third common electrode are covered by a transparent buffer layer, and
  an organic material layer including a hole injection layer, a hole transport layer, and an electron transport layer is positioned in the first light emitting unit, the second light emitting unit, and the third light emitting unit.

17. The organic light emitting diode display of claim 16, wherein:
  the first pixel, the second pixel, and the third pixel are included in plural, and
  the organic material layer defines openings between the first pixels, between the second pixels, and between the third pixels.

18. The organic light emitting diode display of claim 6, further comprising:
  a first sealant along one end of the folded substrate to seal the first light emitting unit and the second light emitting unit; and
  a second sealant along an opposite end of the folded substrate to seal the third light emitting unit.

* * * * *